United States Patent
Wang et al.

(10) Patent No.: US 11,521,846 B2
(45) Date of Patent: Dec. 6, 2022

(54) METHODS FOR PATTERNING A SILICON OXIDE-SILICON NITRIDE-SILICON OXIDE STACK AND STRUCTURES FORMED BY THE SAME

(71) Applicant: Taiwan Semiconductor Manufacturing Company Limited, Hsinchu (TW)

(72) Inventors: Yi-Ren Wang, Hsinchu (TW); Yuan-Chih Hsieh, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 315 days.

(21) Appl. No.: 16/715,094

(22) Filed: Dec. 16, 2019

(65) Prior Publication Data
US 2021/0183641 A1     Jun. 17, 2021

(51) Int. Cl.
*H01L 21/31*        (2006.01)
*H01L 21/02*        (2006.01)
(Continued)

(52) U.S. Cl.
CPC .......... *H01L 21/0217* (2013.01); *C23C 16/04* (2013.01); *C23C 16/345* (2013.01);
(Continued)

(58) Field of Classification Search
CPC .......... H01L 21/02164; H01L 21/0217; H01L 21/02271; H01L 21/3213; H01L 29/41733;
(Continued)

(56) References Cited

U.S. PATENT DOCUMENTS 6,500,768 B1    12/2002   Shields et al.
2004/0256619 A1*  12/2004  Nomura ............ H01L 29/66757
                                                257/E21.414
(Continued)

FOREIGN PATENT DOCUMENTS

JP      2013207174 A  * 10/2013
KR    20080112281 A    12/2008
(Continued)

OTHER PUBLICATIONS

Taiwan Office Action dated Oct. 27, 2020 for TW Application No. 10921024780, 9 pages.
(Continued)

*Primary Examiner* — Brook Kebede
(74) *Attorney, Agent, or Firm* — The Marbury Law Group, PLLC

(57) ABSTRACT

A layer stack is formed over a conductive material portion located on a substrate. The layer stack contains a first silicon oxide layer, a silicon nitride layer formed by chemical vapor deposition, and a second silicon oxide layer. A patterned etch mask layer including an opening is formed over the layer stack. A via cavity extending through the layer stack and down to the conductive material portion is formed by isotropically etching portions of the layer stack underlying the opening in the patterned etch mask layer using an isotropic etch process. A buffered oxide etch process may be used, in which the etch rate of the silicon nitride layer is less than, but is significant enough, compared to the etch rate of the first silicon oxide layer to provide tapered straight sidewalls on the silicon nitride layer. An optical device including a patterned layer stack can be provided.

20 Claims, 11 Drawing Sheets

(51) Int. Cl.
  C23C 16/04  (2006.01)
  C23C 16/34  (2006.01)
  C23C 16/40  (2006.01)
  H01L 21/3213  (2006.01)

(52) U.S. Cl.
  CPC ...... *C23C 16/401* (2013.01); *H01L 21/02164* (2013.01); *H01L 21/02271* (2013.01); *H01L 21/3213* (2013.01)

(58) Field of Classification Search
  CPC ......... H01L 29/66757; H01L 29/66765; H01L 21/76804; C23C 16/04; C23C 16/345; C23C 16/401
  USPC ........................................................ 438/763
  See application file for complete search history.

(56) References Cited

U.S. PATENT DOCUMENTS

| | | | |
|---|---|---|---|
| 2005/0032266 A1* | 2/2005 | Suzuki | H01L 21/76804 438/50 |
| 2005/0032354 A1 | 2/2005 | Chu et al. | |
| 2008/0190886 A1 | 8/2008 | Choi et al. | |
| 2012/0168880 A1 | 7/2012 | Zhang | |
| 2015/0348984 A1 | 12/2015 | Yada et al. | |
| 2017/0178923 A1 | 6/2017 | Surla et al. | |
| 2017/0365487 A1 | 12/2017 | Shen et al. | |

FOREIGN PATENT DOCUMENTS

| | | |
|---|---|---|
| KR | 20150137224 A | 12/2015 |
| TW | 200717694 A | 5/2007 |
| TW | 201118950 A | 6/2011 |
| TW | 201825446 A | 7/2018 |
| TW | 201912619 A | 4/2019 |

OTHER PUBLICATIONS

KIPO, Korean Office Action dated Sep. 1, 2021 for TW Application No. 1020200031863, 5 pages.

Taiwan Patent Office, Taiwan Office Action dated Jun. 20, 2022 for TW Application No. 109108276; 6 pages.

* cited by examiner

METHODS FOR PATTERNING A SILICON OXIDE-SILICON NITRIDE-SILICON OXIDE STACK AND STRUCTURES FORMED BY THE SAME

BACKGROUND

The present disclosure is directed to microfabrication methods, and specifically to methods of patterning a silicon oxide-silicon nitride-silicon oxide stack and structures formed by the same.

Microscopic-scale devices are used in a variety of applications, such as personal computers, cell phones, digital cameras, and other electronic equipment. In many instances such microscopic-scale devices may include optical devices. Such microscopic-scale devices are typically fabricated by sequentially depositing various material layers over a substrate, and subsequently patterning the material layers using lithographic patterning processes and etch processes. Microfabrication processes can be employed to improve the integration density of various components by continual reductions in minimum feature size, which allow more components to be integrated into a given area.

A silicon oxide-silicon nitride-silicon oxide stack may be used as an optical filter that takes advantage of the differences in the refractive indices of the various layers. Further, such as silicon oxide-silicon nitride-silicon oxide stack may be employed to provide passivation over a conductive structure by blocking diffusion of moisture, ionic impurities, and hydrogen atoms, and to enhance reliability and lifetime of the conductive structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
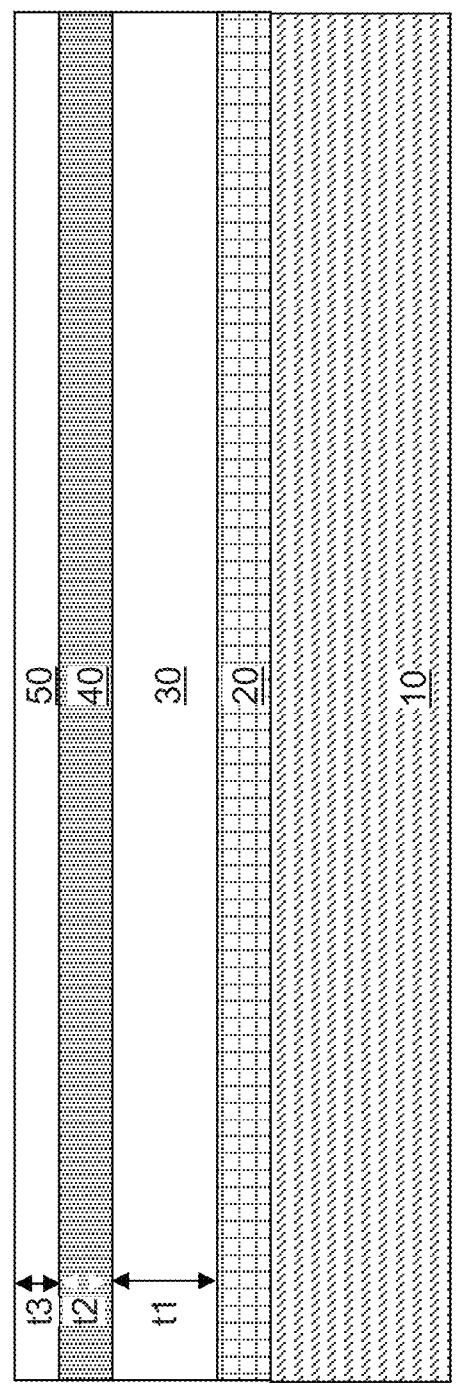
FIG. 1 is a vertical cross-sectional view of an exemplary structure after formation of a conductive material portion and a layer stack that contains, from bottom to top, a first silicon oxide layer, a silicon nitride layer, and a second silicon oxide layer over a substrate in accordance with an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to FIG. 1, an exemplary structure in accordance with an embodiment of the present disclosure is illustrated, which may include a substrate 10, a conductive material portion 20 located on a front surface of the substrate 10, and a layer stack that contains, from bottom to top, a first silicon oxide layer 30, a silicon nitride layer 40, and a second silicon oxide layer 50. The substrate 10 may include a dielectric material, a conductive material, and/or a semiconductor material. In one embodiment, the substrate 10 can include, and/or can consist of, a transparent dielectric material such as fused silica, quartz, and glass. In one embodiment, the substrate 10 may have a thermal conductivity less than $10 \times W/(m \cdot K)$. For example, fused silica, quartz, and glass have thermal conductivities of about $1.3 \times W/(m \cdot K)$. The substrate 10 can include a material having a thermal conductivity less than $0.1 \times W/(m \cdot K)$. The substrate 10 may have a sufficient thickness to provide mechanical support to the conductive material portion 20 and the layer stack (30, 40, 50). In one embodiment, the substrate 10 may have a thickness in a range from 10 microns to 3 mm, although lesser and greater thicknesses can also be used.

At least one conductive material portion 20 can be formed over the front surface of the substrate 10. Each conductive material portion 20 includes at least one conductive material, which may include at least one metallic material or at least one transparent conductive material (such as a conductive metal oxide material). In one embodiment, each conductive material portion 20 can include an elemental metal such as copper, tungsten, tantalum, titanium, ruthenium, or cobalt, an intermetallic alloy of at least two elemental metals, and/or a conductive metallic nitride material such as tungsten nitride, tantalum nitride, or titanium nitride. Alternative or additionally, each conductive material portion 20 can include, and/or consist essentially of, a conductive metal oxide material such as doped zinc oxide, indium tin oxide, cadmium tin oxide ($Cd_2SnO_4$), zinc stannate ($Zn_2SnO_4$), and doped titanium dioxide ($TiO_2$). Exemplary doped zinc oxide materials include boron-doped zinc oxide, fluorine doped zinc oxide, gallium doped zinc oxide, and aluminum doped zinc oxide. Other suitable materials are within the contemplated scope of disclosure. The conductive material of the at least one conductive material portion 20 can be deposited by a chemical vapor deposition process (CVD), a physical vapor deposition (PVD) process, electroplating, electroless plating, or a combination thereof. Each conductive material portion 20 can be formed by patterning the conductive material, for example, by applying and lithographically patterning a photoresist layer over the conductive material, and by transferring the pattern in the photoresist layer through the deposited conductive material portion using an etch process that uses the patterned photoresist layer as an etch mask. The etch process can include an anisotropic etch process such as a reactive ion etch process and/or an isotropic etch process such as a wet etch process. The thickness of each conductive material portion 20 can be in a range from 50 nm to 3,000 nm, such as from 100 nm to 1,000 nm, although lesser and greater thicknesses can also be used. The conductive material portion 20 can include a transparent conductive films (TCFs) such as transparent conductive oxide (TCO), transparent conductive polymers, ultra thin metal films, and etc. Other suitable materials for use as the conductive material portion are within the contemplated scope of disclosure.

Subsequently, the layer stack of the first silicon oxide layer 30, the silicon nitride layer 40, and the second silicon oxide layer 50 can be formed over the at least one conductive material portion 20. The first silicon oxide layer 30 can be formed by depositing a first silicon oxide material using a first chemical vapor deposition process. The first silicon oxide material may have an etch rate that is on the same order of magnitude as the etch rate of thermal silicon oxide in a wet etch process using a buffered oxide etch solution including a 6:1 volume ratio mixture of 40% $NH_4F$ in water to 49% HF in water at room temperature (which is referred to as a "6:1 BOE solution" hereafter). Generally, all deposited silicon oxide material has an etch rate in hydrofluoric acid-based etchants that is not less than the etch rate of thermal silicon oxide in the same etchant. Thermal silicon oxide refers to silicon oxide formed by thermal oxidation of silicon. As used herein, all etch rates are measured at room temperature (20 degrees Celsius) unless otherwise specified. In one embodiment, the first silicon oxide material can provide an etch rate in a 6:1 BOE solution that is less than 3.0 times the etch rate of thermal silicon oxide in a 6:1 BOE solution. In one embodiment, the etch rate of the first silicon oxide material in the 6:1 BOE solution can be less than 2.0 times, and may be less than 1.25 times, the etch rate of thermal silicon oxide in the 6:1 BOE solution. All etch rates are measured at room temperature, i.e., at 20 degrees Celsius.

In one embodiment, the first chemical vapor deposition process decomposes a silicon oxide precursor gas to deposit the first silicon oxide material of the first silicon oxide layer 30. The first chemical vapor deposition process can be a thermal chemical vapor deposition process in which the silicon oxide precursor gas is thermally decomposed, or can be a plasma enhanced chemical vapor deposition process in which the silicon oxide precursor gas is decomposed in a plasma environment. In one embodiment, the first silicon oxide layer comprises a first silicon oxide material formed by thermal decomposition or plasma decomposition of tetraethylorthosilicate (TEOS). In one embodiment, the first silicon oxide material can be an undoped silicate glass material, i.e., a silicate glass material that does not include p-type dopants (such as boron) or n-type dopants (such as phosphorus or arsenic). In one embodiment, the undoped silicate glass material of the first silicon oxide layer 30 can consist essentially of silicon atoms, oxygen atoms, carbon atoms at an atomic concentration in a range from 0.005% (i.e. 50 parts per million (p.p.m.)) to 0.1% (i.e., 1,000 parts per million), and hydrogen atoms at an atomic concentration in a range from 0.01% (100 parts per million) to 1.0% (10,000 parts per million), such as from 0.05% (500 parts per million) to 0.5% (5,000 parts per million). In one embodiment, the undoped silicate glass material of the first silicon oxide layer 30 can be subsequently annealed prior to, or after, deposition of the second silicon oxide layer 30 to outgass moisture and hydrogen gas, thereby reducing the etch rate in a 6:1 BOE solution.

Alternatively, the first silicon oxide material can be a doped silicate glass material such as phosphosilicate glass, borosilicate glass, fluorosilicate glass, arsenosilicate glass, or borophosphosilicate glass. The concentration of dopants in the doped silicate glass material can be selected such that the etch rate of the first silicon oxide material in the 6:1 BOE solution is not greater than 3.0 times the etch rate of thermal silicon oxide in the 6:1 BOE solution. The thickness of the first silicon oxide layer 30 can be in a range from 100 nm to 1,000 nm, such as from 200 nm to 500 nm, although lesser and greater thicknesses can also be used. The thickness of the first silicon oxide layer 30 is hereafter referred to as a first thickness t1. In one embodiment, the doped silicate glass material of the first silicon oxide layer 30 can consist essentially of silicon atoms, oxygen atoms, dopant atoms (such as boron atoms, phosphorus atoms, arsenic atoms, and/or fluorine atoms), carbon atoms at an atomic concentration in a range from 0.005% (i.e. 50 parts per million (p.p.m.)) to 0.1% (i.e., 1,000 parts per million), and hydrogen atoms at an atomic concentration in a range from 0.01% (100 parts per million) to 1.0% (10,000 parts per million), such as from 0.05% (500 parts per million) to 0.5% (5,000 parts per million). In case the first silicon oxide layer 30 includes an undoped silicate glass or a doped silicate glass formed by a plasma enhanced chemical vapor deposition process employing TEOS as a precursor gas, the first silicon oxide layer 30 can have a refractive index in a range from 1.40 to 1.55, such as from 1.43 to 1.50.

The silicon nitride layer 40 can be formed by depositing a silicon nitride material directly on a top surface of the first silicon oxide layer 30 using a second chemical vapor deposition process. The silicon nitride material of the silicon nitride layer 40 may be a stoichiometric silicon nitride material in which an atomic ratio of silicon atoms to nitrogen atoms is at, or close to, 3:4, i.e., a silicon nitride material having the chemical composition of $Si_3N_4$. In other words, the silicon nitride material of the silicon nitride layer 40 is not silicon rich, but a sufficient amount of nitrogen-containing gas (such as ammonia or nitrogen) is provided during the second chemical vapor deposition process to ensure the stoichiometric composition of the silicon nitride material of the silicon nitride layer 40.

Further, the silicon nitride material of the silicon nitride layer 40 can be formed by a plasma enhanced chemical vapor deposition process at a relatively low temperature, such as less than 300 degrees Celsius. Compared to silicon nitride materials that are formed by thermal chemical vapor deposition at a temperature greater than 700 degrees Celsius or employed as sputtering targets, a silicon nitride material deposited in a plasma enhanced chemical vapor deposition process can have a lower refractive index. For example, thermal silicon nitride materials or silicon nitride materials employed as a sputtering (physical vapor deposition target) can have a refractive index in a range from 1.99 to 2.22 at 632.8 nm wavelength (which is the laser wavelength of typical thickness measurement tools). In contrast, a silicon nitride material deposited in a plasma enhanced chemical vapor deposition process can have a refractive index in a range from 1.88 to 1.95 at 632.8 nm wavelength. The reduction in the refractive index in the silicon nitride material deposited in a plasma enhanced chemical vapor deposition process may be due to lower density of the silicon nitride material, which can be caused by presence of a higher fraction of volume that voids occupy and/or incorporation of process gases (such as nitrogen or argon) within the silicon nitride material deposited in the plasma enhanced chemical vapor deposition process.

In one embodiment, the etch rate of the silicon nitride material of the silicon nitride layer 40 in an n:1 BOE solution, n being in a range from 3 to 12, may be in a range from 1/10 times the etch rate of the first silicon oxide material of the first silicon oxide layer 30 in the n:1 BOE solution to 1/2 times the etch rate of the first silicon oxide material of the first silicon oxide layer 30 in the n:1 BOE solution. In one embodiment, the etch rate of the silicon nitride material of the silicon nitride layer 40 in a 6:1 BOE solution may be in a range from 1/10 times the etch rate of the first silicon oxide material of the first silicon oxide layer 30 in the 6:1 BOE solution to 1/2 times the etch rate of the first silicon oxide material of the first silicon oxide layer 30 in the 6:1 BOE solution.

Generally, a silicon to nitrogen ratio in a silicon nitride material may have a significant effect on the etch rate of the silicon nitride material in a diluted or buffered hydrofluoric acid. The etch rate of a silicon nitride material in a diluted or buffered hydrofluoric acid increases with a decrease in the silicon to nitrogen ratio. Thus, the etch rate of a stoichiometric silicon nitride material having a silicon to nitrogen ratio of 3:4, i.e., 0.75, has a greater etch rate than a silicon-rich silicon nitride material. The etch rate of the silicon nitride material in the silicon nitride layer 40 in a 6:1 BOE solution can be increased by adjusting process parameters. For example, an increase in the deposition rate of the silicon nitride material can increase the etch rate of the silicon nitride material in a hydrofluoric acid-based solution.

In the second chemical vapor deposition process, a silicon precursor gas and a nitrogen precursor gas combine to form a stoichiometric silicon nitride material. In one embodiment, the second chemical vapor deposition process may use silane or dichlorosilane as a silicon-containing precursor gas, and ammonia or nitrogen as a nitrogen-containing precursor gas. In one embodiment, the second chemical vapor deposition process can comprise a plasma enhanced chemical vapor deposition process using a silicon-containing precursor gas (such as silane or dichlorosilane) and a nitrogen-containing precursor gas (such as ammonia or nitrogen). In one embodiment, the second chemical vapor deposition process can comprise a thermal chemical vapor deposition process using a silicon-containing precursor gas (such as silane or dichlorosilane) and a nitrogen-containing precursor gas (such as ammonia). The thickness of the silicon nitride layer 40 can be in a range from 50 nm to 500 nm, such as from 100 nm to 250 nm, although lesser and greater thicknesses can also be used. The thickness of the silicon nitride layer 40 is hereafter referred to as a second thickness t2.

The second silicon oxide layer 50 can be formed by depositing a second silicon oxide material using a third chemical vapor deposition process. The second silicon oxide material may have an etch rate that is comparable to the etch rate of thermal silicon oxide in a wet etch process using 100:1 dilute hydrofluoric acid at room temperature. In one embodiment, the second silicon oxide material can provide an etch rate in the 6:1 BOE solution that is less than 3.0 times the etch rate of thermal silicon oxide in the 6:1 BOE solution.

In one embodiment, the second chemical vapor deposition process decomposes a silicon oxide precursor gas to deposit the second silicon oxide material of the second silicon oxide layer 50. The second chemical vapor deposition process can be a thermal chemical vapor deposition process in which the silicon oxide precursor gas is thermally decomposed, or can be a plasma enhanced chemical vapor deposition process in which the silicon oxide precursor gas is decomposed in a plasma environment. In one embodiment, the second silicon oxide layer comprises a second silicon oxide material formed by thermal decomposition or plasma decomposition of tetraethylorthosilicate. In one embodiment, the second silicon oxide material can be an undoped silicate glass material. In one embodiment, the undoped silicate glass material of the second silicon oxide layer 50 can consist essentially of silicon atoms, oxygen atoms, carbon atoms at an atomic concentration in a range from 0.005% (i.e. 50 parts per million (p.p.m.)) to 0.1% (i.e., 1,000 parts per million), and hydrogen atoms at an atomic concentration in a range from 0.01% (100 parts per million) to 1.0% (10,000 parts per million), such as from 0.05% (500 parts per million) to 0.5% (5,000 parts per million). In one embodiment, the undoped silicate glass material of the second silicon oxide layer 50 can be subsequent annealed to outgas moisture and hydrogen gas, thereby reducing the etch rate in a 6:1 BOE solution. Alternatively, the second silicon oxide material can be a doped silicate glass material such as phosphosilicate glass, borosilicate glass, fluorosilicate glass, arsenosilicate glass, or borophosphosilicate glass. The concentration of dopants in the doped silicate glass material can be selected such that the etch rate of the second silicon oxide material in the 6:1 BOE solution is not greater than 3.0 times the etch rate of thermal silicon oxide in the 6:1 BOE solution. The thickness of the second silicon oxide layer 50 can be in a range from 50 nm to 500 nm, such as from 100 nm to 250 nm, although lesser and greater thicknesses can also be used. The thickness of the second silicon oxide layer 50 is hereafter referred to as a third thickness t3. In one embodiment, the doped silicate glass material of the second silicon oxide layer 50 can consist essentially of silicon atoms, oxygen atoms, dopant atoms (such as boron atoms, phosphorus atoms, arsenic atoms, and/or fluorine atoms), carbon atoms at an atomic concentration in a range from 0.005% (i.e. 50 parts per million (p.p.m.)) to 0.1% (i.e., 1,000 parts per million), and hydrogen atoms at an atomic concentration in a range from 0.01% (100 parts per million) to 1.0% (10,000 parts per million), such as from 0.05% (500 parts per million) to 0.5% (5,000 parts per million). In case the second silicon oxide layer 50 includes an undoped silicate glass or a doped silicate glass formed by a plasma enhanced chemical vapor deposition process employing TEOS as a precursor gas, the second silicon oxide layer 50 can have a refractive index in a range from 1.40 to 1.55, such as from 1.43 to 1.50.

In one embodiment, the first silicon oxide material and the second silicon oxide material can be undoped silicate glass materials. In one embodiment, the second silicon oxide material has an etch rate in a range from 0.80 times the etch rate of the first silicon oxide layer in a 6:1 BOE solution to 1.25 times the etch rate of the first silicon oxide layer in a 6:1 BOE solution. In one embodiment, the second silicon oxide material can have the same etch rate in a 6:1 BOE solution as the first silicon oxide material. In one embodiment, the second silicon oxide material may be the same as the first silicon oxide material.

Figure 2:
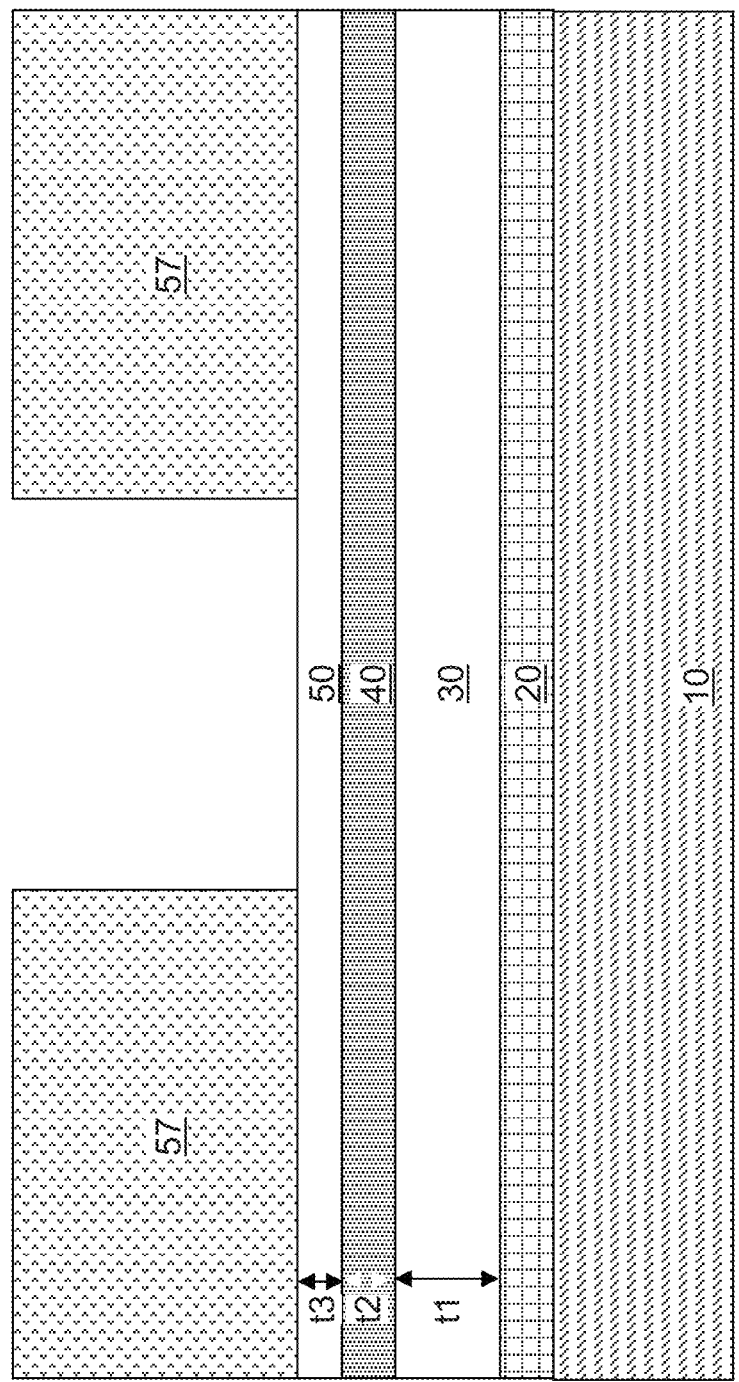
FIG. 2 is a vertical cross-sectional view of the exemplary structure after formation of a patterned etch mask layer in accordance with an embodiment of the present disclosure.

Referring to FIG. 2, a patterned etch mask layer 57 can be formed over a top surface of the second silicon oxide layer 50. In one embodiment, the patterned etch mask layer 57 can include a patterned photoresist material layer. In one embodiment, the patterned photoresist material layer can include a mid-ultraviolet (MUV) photoresist material or deep ultraviolet (DUV) photoresist material, and may include a positive photoresist material or a negative photoresist material. A positive photoresist material is a photoresist material in which cross-linking within polymer molecules is removed by exposure to light, and thus, can be patterned by removing lithographically exposed portions while preserving portions that are not exposed to light. A negative photoresist material is a photoresist material in which cross-linking between monomer molecules is induced by exposure to light, and thus, may be patterned by removing portions that are not lithographically exposed to light.

In embodiments in which the patterned etch mask layer 57 includes a patterned photoresist material layer, the patterned etch mask layer 57 can be formed by applying a photoresist material, lithographically exposing the photoresist material, and developing the photoresist material. The photoresist material can be developed by removing either lithographically exposed portions (in the case of a positive photoresist material) or lithographically unexposed portions (in the case of a negative photoresist material). At least one opening can be formed in the photoresist material to provide the patterned etch mask layer 57. An opening through the patterned etch mask layer 57 may have a horizontal cross-sectional shape of a rectangle, a circle, an ellipse or an oval, a rounded rectangle, or another polygon or another polygon with rounded corners. In one embodiment, an opening through the patterned etch mask layer 57 may have a parallel pair of straight sidewalls that laterally extends along a horizontal direction (see e.g., FIG. 2). In another embodiment, an opening through the patterned etch mask layer 57 may have a circular or an elliptical horizontal cross-sectional shape. Each opening through the patterned etch mask layer 57 may vertically extend to a top surface of an underlying conductive material portion 20. A top surface of a conductive material portion 20 can be physically exposed underneath an opening in the patterned etch mask layer 57.

Figure 3:
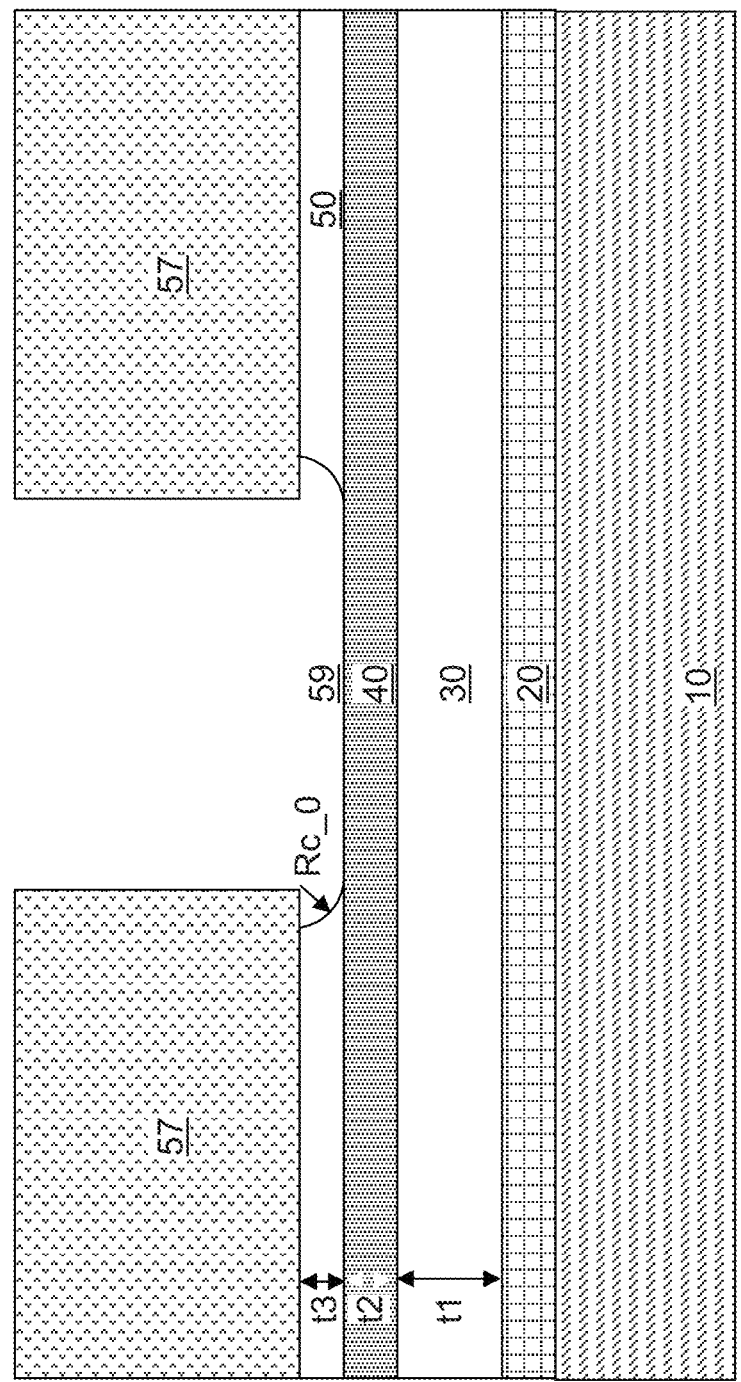
FIG. 3 is a vertical cross-sectional view of the exemplary structure after a first step of an isotropic etch process that etches through the second silicon oxide layer in accordance with an embodiment of the present disclosure.

Referring to FIG. 3, an isotropic etch process can be performed to etch portions of the layer stack (30, 40, 50) that underlie each opening through the patterned etch mask layer 57. In an embodiment, a single isotropic etch process can be used to etch through the entire thickness of the layer stack (30, 40, 50), i.e., t1+t2+t3, and to physically expose a respective underlying portion of the conductive material portion 20. In one embodiment, the chemistry of the single isotropic etch process can be selected to etch through each material of the layer stack (30, 40, 50) at comparable etch rates that do not differ from one another by factors greater than 6.0. In one embodiment, the isotropic etch process may comprise a wet etch process that sequentially etches portions of the second silicon oxide layer 50, the silicon nitride layer 40, and the first silicon oxide layer 30.

In one embodiment, the isotropic etch process can include a single wet etch process using a buffered oxide etch solution including an n:1 volume ratio mixture of 40% $NH_4F$ in water to 49% HF in water. The number n can be in a range from 3 to 12, such as from 4 to 10 and/or from 5 to 7.5. In an illustrative example, the number n can be 6. The wet etch process can be performed at room temperature, i.e., at 20 degrees Celsius. With reference to FIGS. 3-6, the single wet etch process may sequentially etch through a portion of the second silicon oxide layer 50 underlying an opening through the patterned etch mask layer 57, a portion of the silicon nitride layer 40 underlying the opening through the patterned etch mask layer 57, and a portion of the first silicon oxide layer 30 underlying the opening through the patterned etch mask layer 57 to form a via cavity 59. Different time periods of the single isotropic etch process can be labeled as different steps of the single isotropic etch process, which are sequential segments of a continuous duration of time during the single isotropic etch process. For example, the duration of time during which a bottommost surface of the via cavity 59 is a surface of the second silicon oxide layer 50 is herein referred to as a first step of the isotropic etch process, the duration of time during which a bottommost surface of the via cavity 59 is a surface of the silicon nitride layer 40 is herein referred to as a second step of the isotropic etch process, and the duration of time during which a bottommost surface of the via cavity 59 is a surface of the first silicon oxide layer 30 is herein referred to as a third step of the isotropic etch process.

The time at which the vertical cross-sectional profile of the exemplary structure illustrated in FIG. 3 corresponds to a point in time at which the first step of the single isotropic etch process (such as a wet etch process using an n:1 BOE solution) terminates and the second step of the single isotropic etch process commences. During the first step of the isotropic etch process, the material of the second silicon oxide layer 50 (i.e., the second silicon oxide material) is isotropically etched with an undercut underneath the patterned etch mask layer 57, while a remaining portion of the second silicon oxide layer 50 covers the silicon nitride layer 40 underneath the patterned etch mask layer 57. The sidewalls of the second silicon oxide layer 50 may be concave surfaces due to the isotropic nature of the etch process such as a wet etch process using an n:1 BOE solution, i.e., a buffered oxide etch solution including an n:1 volume ratio mixture of 40% $NH_4F$ in water to 49% HF in water. The radius of curvature Rc_0 of the concave sidewalls of the second silicon oxide layer 50 at the end of the first step of the isotropic etch process may be the same as the third thickness t3, which is the thickness of the second silicon oxide layer 50.

Figure 4A:
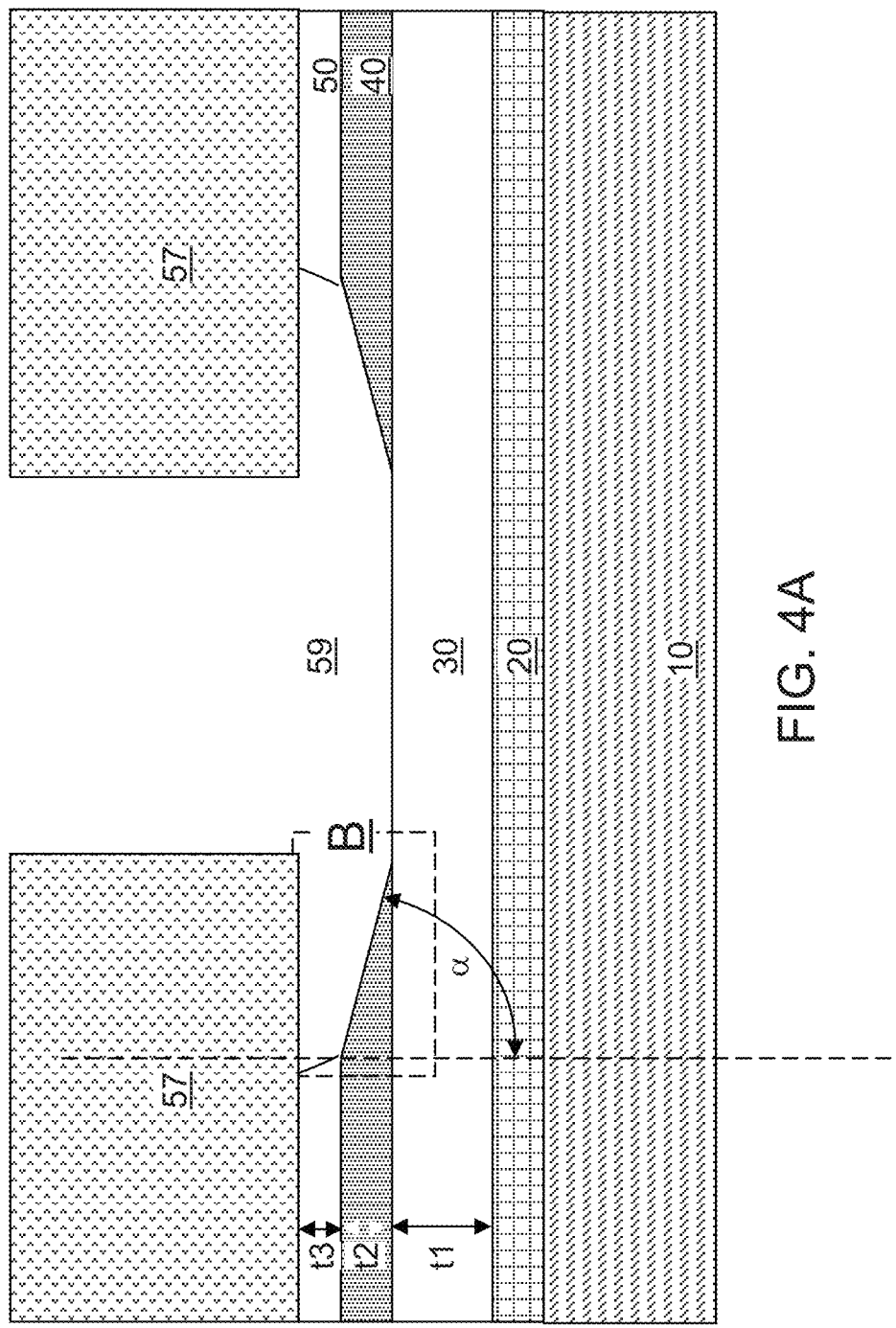
FIG. 4A is a vertical cross-sectional view of the exemplary structure after a second step of the isotropic etch process that etches through the silicon nitride layer in accordance with an embodiment of the present disclosure.
Figure 4B:
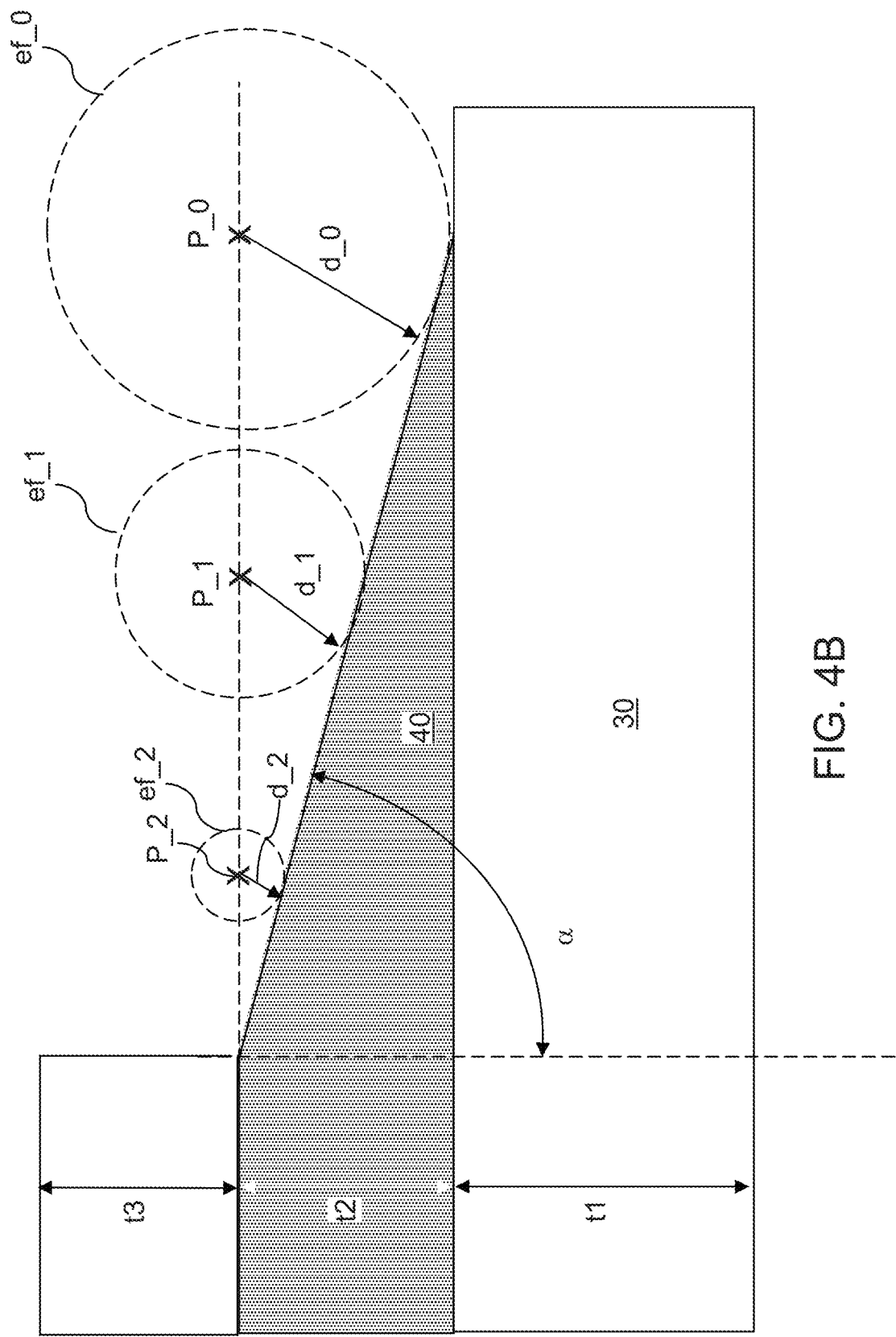
FIG. 4B is a magnified view of region B as illustrated in FIG. 4A.

Referring to FIGS. 4A and 4B, the single isotropic etch process can continue into the second step, in which the portion of the silicon nitride layer 40 that underlies the opening in the patterned etch mask layer 57 may be isotropically etched by the isotropic etchant while portions of the second silicon oxide layer 50 that are located underneath proximal portions of the patterned etch mask layer 57 around each opening therethrough may be collaterally etched.

In one embodiment, the etch rate of the silicon nitride material of the silicon nitride layer 40 in an n:1 BOE solution, n being in a range from 3 to 12, may be in a range from 1/10 times the etch rate of the second silicon oxide material of the second silicon oxide layer 50 in the n:1 BOE solution to 1/2 times the etch rate of the second silicon oxide material of the second silicon oxide layer 50 in the n:1 BOE solution. In one embodiment, the etch rate of the silicon nitride material of the silicon nitride layer 40 in a 6:1 BOE solution may be in a range from 1/10 times the etch rate of the second silicon oxide material of the second silicon oxide layer 50 in the 6:1 BOE solution to 1/2 times the etch rate of the second silicon oxide material of the second silicon oxide layer 50 in the 6:1 BOE solution.

Generally, the silicon nitride material of the silicon nitride layer 40 may be etched at a lower etch rate than an etch rate of the second silicon oxide layer 50. The ratio of the etch rate of the silicon nitride material of the silicon nitride layer 40 to the etch rate of the second silicon oxide material of the second silicon oxide layer 50 can be maintained as high as possible by using a stoichiometric silicon oxide formed by chemical vapor deposition of the silicon nitride layer 40.

Figure 5:
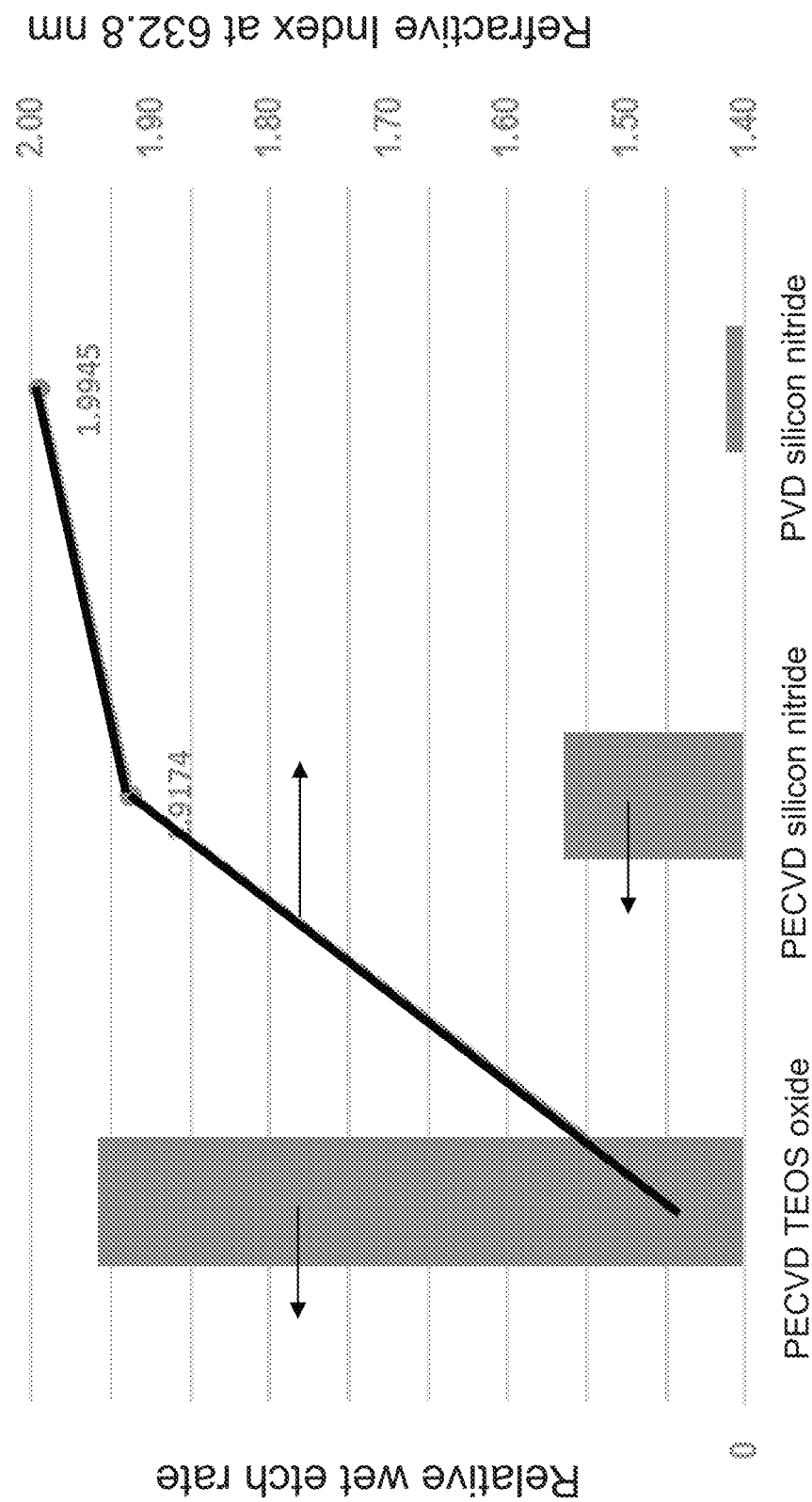
FIG. 5 is a graph comparing etch rates and refractive indices of a CVD TEOS oxide, a CVD silicon nitride, and a PVD silicon nitride according to an embodiment of the present disclosure.

Referring to FIG. 5, a graph is provided illustrating a comparison of the etch rates and refractive indices of a CVD TEOS oxide, a CVD silicon nitride, and a PVD silicon nitride as observed under laboratory conditions. The CVD TEOS oxide was formed by a plasma enhanced chemical vapor deposition process at 280 degrees Celsius using tetraethylorthosilicate (TEOS) as a silicon oxide precursor gas. The CVD silicon nitride was formed by a plasma enhanced chemical vapor deposition process at 275 degrees Celsius using silane as a silicon-containing precursor gas and nitrogen gas as a nitrogen-containing precursor gas. The PVD silicon nitride was deposited by sputtering of a silicon nitrogen material from a sputtering target at 25 degrees Celsius. The ratio of the etch rate of the CVD silicon nitride in the 6:1 BOE solution to the etch rate of the CVD silicon oxide in the 6:1 BOE solution was about 0.28, while the ratio of the etch rate of the PVD silicon nitride in the 6:1 BOE solution to the etch rate of the CVD silicon oxide in the 6:1 BOE solution was about 0.03. Thus, the difference in the etch rates is lesser between the CVD silicon nitride and the CVD silicon oxide than between the PVD silicon nitride and the CVD silicon oxide.

In one embodiment, the etch rate of the silicon nitride layer 40 in an n:1 BOE solution (n being in a range from 3 to 12) can be in a range from 1/10 times an etch rate of the second silicon oxide layer 50 to 1/2 times the etch rate of the second silicon oxide layer 50 in the n:1 BOE solution during the single wet etch process. Likewise, the etch rate of the silicon nitride layer 40 in the n:1 BOE solution can be in a range from 1/10 times an etch rate of the first silicon oxide layer 30 to 1/2 times the etch rate of the first silicon oxide layer 30 in the n:1 BOE solution during the single wet etch process.

In one embodiment, the silicon nitride material of the silicon nitride layer 40 can be formed by a plasma enhanced chemical vapor deposition process, and can have a refractive index in a range from 1.88 to 1.95 at 632.8 nm wavelength. In contrast, a thermal silicon nitride material deposited in a thermal chemical vapor deposition process at a temperature greater than 700 degrees Celsius or a sputtered silicon nitride material deposited in a physical vapor deposition (PVD) process from a sputtering target has a refractive index in a range from 1.99 to 2.02. The microstructure of the silicon nitride material deposited in a plasma enhanced chemical vapor deposition process causes a reduction in the refractive index relative to the refractive index of the thermal silicon nitride material or the sputtered silicon nitride material. In one embodiment, the silicon nitride material of the silicon nitride layer 40 has a refractive index in a range from 1.88 to 1.95 at 632.8 nm wavelength.

Referring back to FIGS. 4A and 4B, the etch rate of the first silicon oxide layer 30 in the n:1 BOE solution may be at least three times (3×) the etch rate of the silicon nitride layer 40 during the isotropic etch process. Because all physically exposed surfaces of the silicon nitride layer 40 are physically exposed to the isotropic etchant (such as the n:1 BOE solution), the vertical etch distance of the silicon nitride layer 40 at the sidewalls of the silicon nitride layer 40 is determined by the lateral offset distance of each point on the sidewalls of the silicon nitride layer 40 from vertical planes that include the sidewalls of the patterned etch mask layer 57. Thus, the sidewalls of the silicon nitride layer 40 may be straight tapered sidewalls that extend from the bottom periphery of a respective concave sidewall of the second silicon oxide layer 50 to a top surface of the first silicon oxide layer 30 at the end of the second step of the single isotropic etch process.

The second silicon oxide material of the second silicon oxide layer 50 may be laterally recessed with concave etch surfaces that has a continually increasing radius of curvature throughout the etch step that etches through the silicon nitride layer 40. The isotropic etchant may be continually supplied to bottom edges of the concave sidewalls of the silicon nitride liner 40 to provide a new concentric etching front for etching the material of the silicon nitride liner 40. The lower etch rate of the silicon nitride material of the silicon nitride layer 40 relative to the etch rate of the second silicon oxide material of the second silicon oxide layer 50 may induce the formation of a series of spherical etch fronts (ef_0, ef_1, ef_2) that grow in radius in time and provides an overlapping surface in the form of a tapered two-dimensional plane having a taper angle with respective to the vertical direction. It is understood that an etched surface in an isotropic etch process recedes along a surface formed by an overlap of an infinite number of etch fronts. Further, it is understood that the etch process occurs only at segments of the surface formed by the overlap of the etch fronts that overlap with the etched material.

Each spherical etch front (ef_0, ef_1, ef_2) has a respective geometrical center within a horizontal plane including the interface between the silicon nitride layer 40 and the second silicon oxide layer 50. Points (P_0, P_1, P_2) corresponding to the geometrical centers of the spherical etch fronts (ef_0, ef_1, ef_2). When the silicon nitride layer 40 is etched through and a top surface of the first silicon oxide layer 30 is physically exposed, a foremost etch front ef_0 centered at an etch initiation point P_0 located at a bottom edge of a concave surface of the second silicon oxide layer t3 becomes an origin of the foremost etch front ef_0. The isotropic etchant initiates etching the silicon nitride material of the silicon nitride layer 40 as the foremost etch front ef_0 grows from a point to a sphere with a finite radius. The etch distance d_0 of the foremost etch front ef_0 increases as the isotropic etch step progresses, and reaches the value of the second thickness t2 when the silicon nitride layer 40 is etched through. Other etch frons are generated as the bottom edge of the concave surface of the second silicon oxide layer 50 laterally recedes, and newly exposed top surface segments of the silicon nitride layer 40 begins to be etched by the isotropic etchant. While an infinite number of etch fronts may be generated during the isotropic etch step, only two other etch fronts (ef_1, ef_2) are illustrated. A first etch front ef_1 can istropically grow once a first etch front center point P_1 becomes physically exposed to the isotropic etchant as a bottom edge of the concave etch surface of the second silicon oxide layer 50 passes through the first etch front center point P_1. A first etch front ef_1 may grow isotropically in a spherical form as the first etch distance d_1 between the first etch front of 1 and the first etch front center point P_1 increases in time. Likewise, a second etch front of 2 can isotropically grow once a second etch front center point P_2 becomes physically exposed to the isotropic etchant as the bottom edge of the concave etch surface of the second silicon oxide layer 50 passes through the second etch front center point P_2. A second etch front of 2 grows isotropically in a spherical form as the second etch distance d_2 between the second etch front of 2 and the second etch front center point P_2 increases in time.

The taper angle □ of the straight tapered sidewalls of the silicon nitride layer 40, as measured from a vertical direction that is perpendicular to the top surface of the conductive material portion 20, can be the arctangent of the ratio of the etch rate of the second silicon oxide layer 50 in the isotropic etchant to the etch rate of the silicon nitride layer 40 in the isotropic etchant. The straight tapered sidewalls of the silicon nitride layer 40 can be in a respective two-dimension (Euclidean) plane. Further, the straight tapered sidewalls of the silicon nitride layer 40 can remain in a respective two-dimension (Euclidean) plane even after an overetch process because the etch rate of the silicon nitride material during the overetch step is isotropic. In an illustrative example, if the isotropic etchant is a 6:1 BOE solution, if the second silicon oxide layer 50 has an etch rate of 8.2 nm/sec in the 6:1 BOE solution, and if the silicon nitride layer 40 has an etch rate of 2.3 nm/sec in the 6:1 BOE solution, the taper angle □ of the straight tapered sidewalls of the silicon nitride layer 40 can be about arctangent {(8.2 nm/sec)/(2.3 nm/sec)}≈1.30 radian≈74.3 degrees. A top surface of the first silicon oxide layer 30 is physically exposed at the end of the second step of the single isotropic etch process, which coincides with the beginning of the third step of the single isotropic etch process. A remaining portion of the silicon nitride layer 40 covers the first silicon oxide layer 30 underneath the patterned etch mask layer 57 at this point in time.

Figure 6:
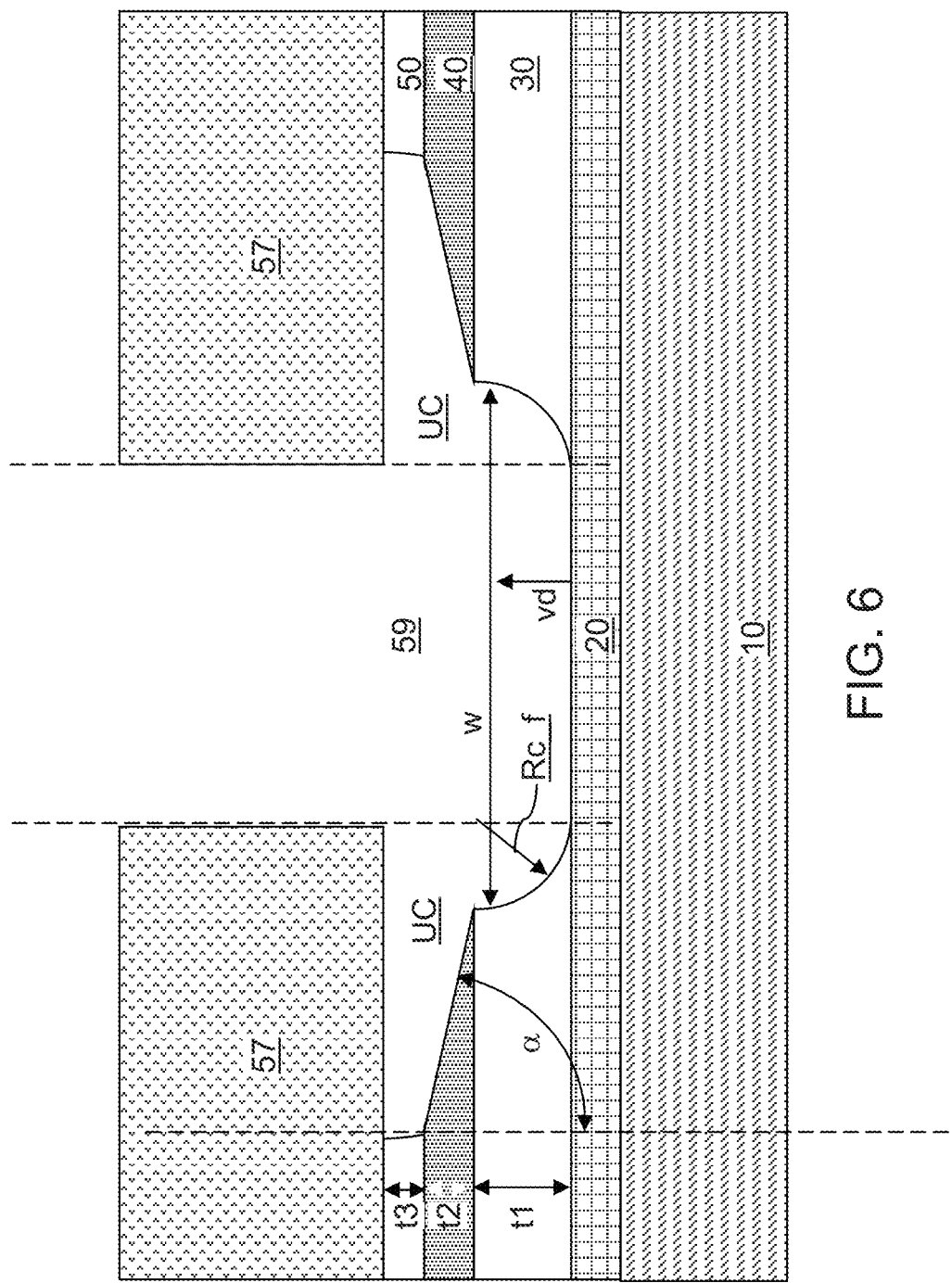
FIG. 6 is a vertical cross-sectional view of the exemplary structure after a third step of the isotropic etch process that etches through the first silicon oxide layer in accordance with an embodiment of the present disclosure.

Referring to FIG. 6, a third step of the isotropic etch process commences as the second step of the isotropic etch terminates. Materials of the first silicon oxide layer 30 and the second silicon oxide layer 50 may be etched while forming concave surfaces, and the material of the silicon nitride layer 40 may be etched while the straight tapered sidewalls of the silicon nitride layer 40 laterally move outward without forming concave surfaces. As discussed above, the etch rates of the first silicon oxide layer 30 and the second silicon oxide layer 50 during the isotropic etch process is at least three times the etch rate of the silicon nitride layer 40. Thus, the straight tapered sidewalls of the silicon nitride layer 40 laterally move outward during the third step of the isotropic etch process. At the point in time at which the top surface of the conductive material portion 20 becomes physically exposed as illustrated in FIG. 6, the radius of curvature Rc_f of the concave surfaces of the first silicon oxide layer 30 can be the same as the first thickness t1, i.e., the thickness of the first silicon oxide layer 30. The third step of the isotropic etch process can include an extended portion after the top surface of the conductive material portion 20 is physically exposed, which is an overetch segment of the third step of the isotropic etch process. The radius of curvature of the concave surfaces of the first silicon oxide layer 30 can increase above the thickness of the first silicon oxide layer 30 during an overetch process that is extended beyond the point of time captured in FIG. 6.

A via cavity 59 extending through the layer stack (30, 40, 50) and down to a top surface of the conductive material portion 20 is formed underneath each opening in the patterned etch mask layer 57. The via cavity 59 may include undercut regions UC at each layer of the layer stack (30, 40, 50). The undercut regions UC correspond to volume that underlie the patterned etch mask layer 57, i.e., a volume having an areal overlap with the patterned etch mask layer 57 in a top-down view along a downward vertical direction. Each sidewall of the layer stack (30, 40, 50) can be located outside the vertical plane including the sidewalls of the patterned etch mask layer 57 that define a respective opening through the patterned etch mask layer 57. A width w of the via cavity 59 strictly increases with a vertical distance vd from a horizontal top surface of the conductive material portion 20.

Figure 7:
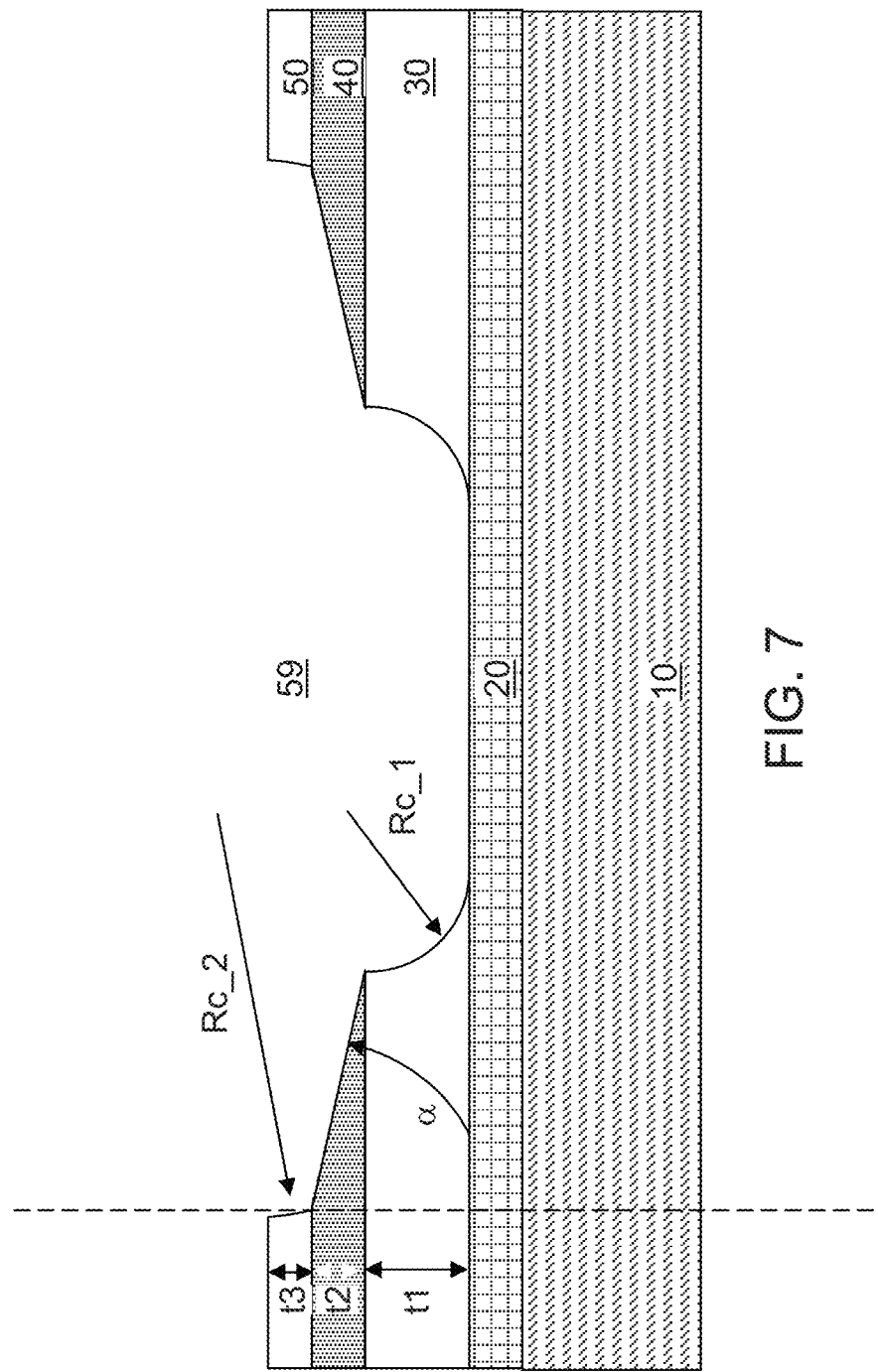
FIG. 7 is a vertical cross-sectional view of the exemplary structure after removal of the patterned etch mask layer in accordance with an embodiment of the present disclosure.

Referring to FIG. 7, the patterned etch mask layer 57 may be removed selective to the materials of the conductive material portion 20 and the layer stack (30, 40, 50). For example, if the patterned etch mask layer 57 includes a photoresist material, the patterned etch mask layer 57 may be removed by ashing or by dissolving in an organic solvent.

The sidewalls of the first silicon oxide layer 30, the silicon nitride layer 40, and the second nitride layer 40 may laterally extend (for example, along a direction that is perpendicular to the plane of the vertical cross-sectional view of FIG. 7) with a uniform vertical cross-sectional profile. Alternatively, the sidewalls of the first silicon oxide layer 30, the silicon nitride layer 40, and the second nitride layer 40 may be located around a substantially circular opening having a circular horizontal cross-sectional shape. Generally, the exemplary structure of embodiments of the present disclosure can have a first concave sidewall of the first silicon oxide layer 30 having a first radius of curvature Rc_1, which is at least the first thickness t1. Further, the exemplary structure of embodiments of the present disclosure can have a second concave sidewall of the second silicon oxide layer 50 having a second radius of curvature Rc_2, which is at least the sum of the third thickness t3, the first thickness t1, and the product of the second thickness t2 and the ratio of the etch rate of the material of the second silicon oxide layer 50 during the isotropic etch process to the etch rate of the material of the silicon nitride layer 40 during the isotropic etch process. In addition, the exemplary structure of embodiments of the present disclosure can include straight tapered sidewalls that extend from a bottom edge of the second concave sidewall of the second silicon oxide layer 50 to a top edge of the first silicon oxide layer 30 with a taper angle a, which can be in a range from 62 degrees to 84 degrees.

Figure 8:
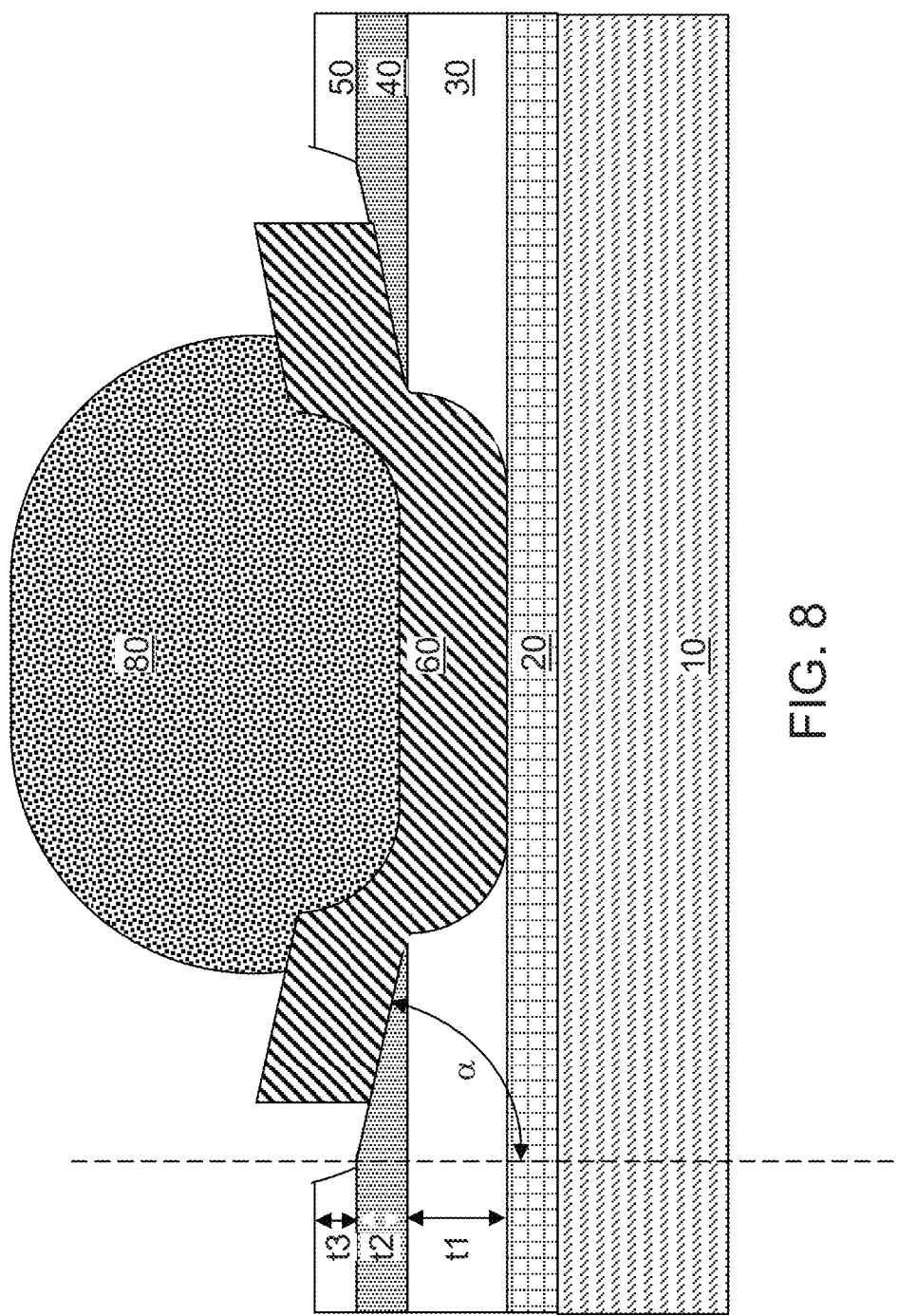
FIG. 8 is a vertical cross-sectional view of the exemplary structure after formation of a metallic contact structure in a via cavity in accordance with an embodiment of the present disclosure.

Referring to FIG. 8, a metallic contact structure (60, 80) may be formed in the via cavity 59 directly on the top surface of the conductive material portion 20. The metallic contact structure (60, 80) can include a combination of a bonding pad 60 and a solder material portion 80. In one embodiment, a plurality of via cavities 59 can be formed through the layer stack (30, 50, 50), and a plurality of metallic contact structures (60, 80) can be formed. In an illustrative example, the bonding pads 60 can be formed by depositing and patterning metallic layers such as an Al/Ni/Au stack, an Al/Ni/Cu stack, a Cu/Ni/Au stack, a Cu/Ni/Pd stack, a Ti/Ni/Au stack, a Ti/Cu/Ni/Au stack, a Ti—W/Cu stack, a Cr/Cu stack, a Cr/Cu/Ni stack, or another under-bump metallurgy (UBM) stack known in the art. The solder material portion 80 includes a solder material such as a Sn—Ag alloy or another tin-based alloy. The lateral dimension (such as a diameter) of the solder material portion 80 can be in a range from 5 micron to 100 microns, although lesser and greater lateral dimensions can also be employed. One of ordinary skill in the art would understand that additional and/or alternative metallic contact structures (60, 80) may be formed in conjunction with the silicon oxide-silicon nitride-silicon oxide stack that may be formed using the novel methods disclosed herein.

Figure 9:
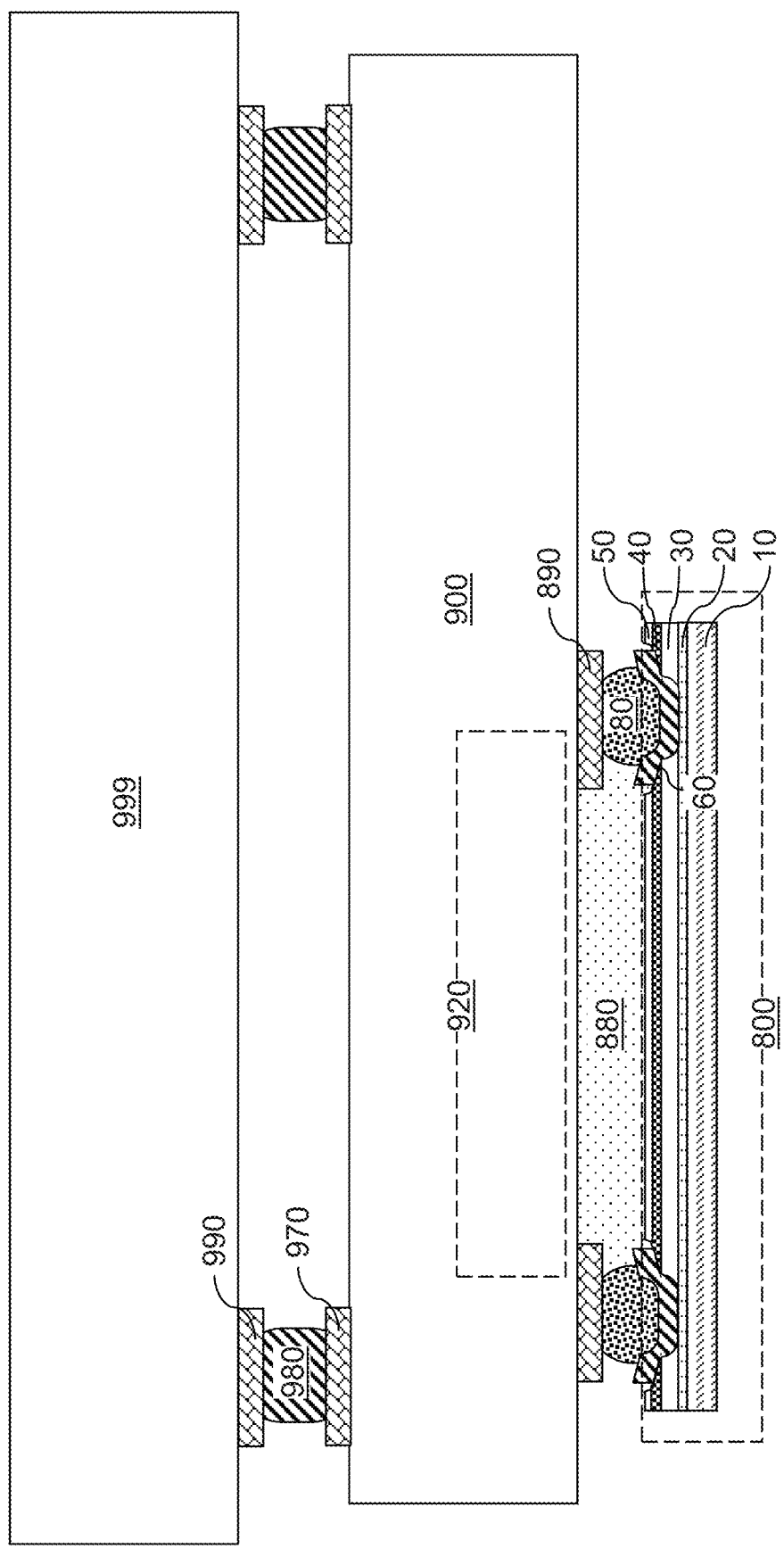
FIG. 9 is a vertical cross-sectional view of an exemplary structure after mounting of a semiconductor die in accordance with an embodiment of the present disclosure.

Referring to FIG. 9, the exemplary structure is illustrated after the optical structure 800 including the substrate 10, the conductive material portion 20, and the layer stack (30, 40, 50) is bonded to a semiconductor chip 900 including an optical semiconductor device 920. The optical semiconductor device 920 can comprise any semiconductor device that can capture or process impinging optical signals or optical images that are transmitted through the optical structure 800. The semiconductor chip 900 may be provided with front bonding pads 890 to which the solder material portions 80 are bonded. Optionally, an optically transparent fill material portion 880 may be provided between the optional structure 800 and the semiconductor chip 900 to prevent condensation and/or contamination.

In an illustrative example, the optical semiconductor device 920 may comprise a complementary metal-oxide-semiconductor (CMOS) image sensor, a charge-coupled device (CCD), an optical sensor array for a light detection and ranging (LIDAR) application, or any suitable semiconductor-based optical signal detection device. In one embodiment, the optical structure 800 may comprise an optical filter that allows, or prohibits, transmission of light in a specific wavelength range. The thicknesses of each layer within the layer stack (30, 40, 50) can be selected to provide a suitable transmission wavelength range within which light passes through while suppressing transmission of light outside the transmission wavelength range.

In another example, the optical structure 800 can include a beam splitter that partially reflects and partially transmits an incident beam. In yet another example, the optical structure 800 can include an optical mirror for a wide wavelength range or for a specific wavelength range. Optionally, the semiconductor chip 900 can be connected to a printed circuit board 999 via bonding structures (970, 980, 990), which may include, for example, chip-side bonding pads 970, solder balls 980, and board-side bonding pads 990.

Generally, the optical structure 800 of the present disclosure may be attached to a semiconductor chip 900 or any other optical device (such as a camera, an optical signal transmission device, or an optical sensor) employing solder material portions, conductive paste, and/or an adhesive material (such as epoxy). Embodiments are expressly contemplated herein in which the semiconductor chip 900 in FIG. 9 is replaced with another optical component that forms an optical module upon integration with the optical structure 800.

Figure 10:
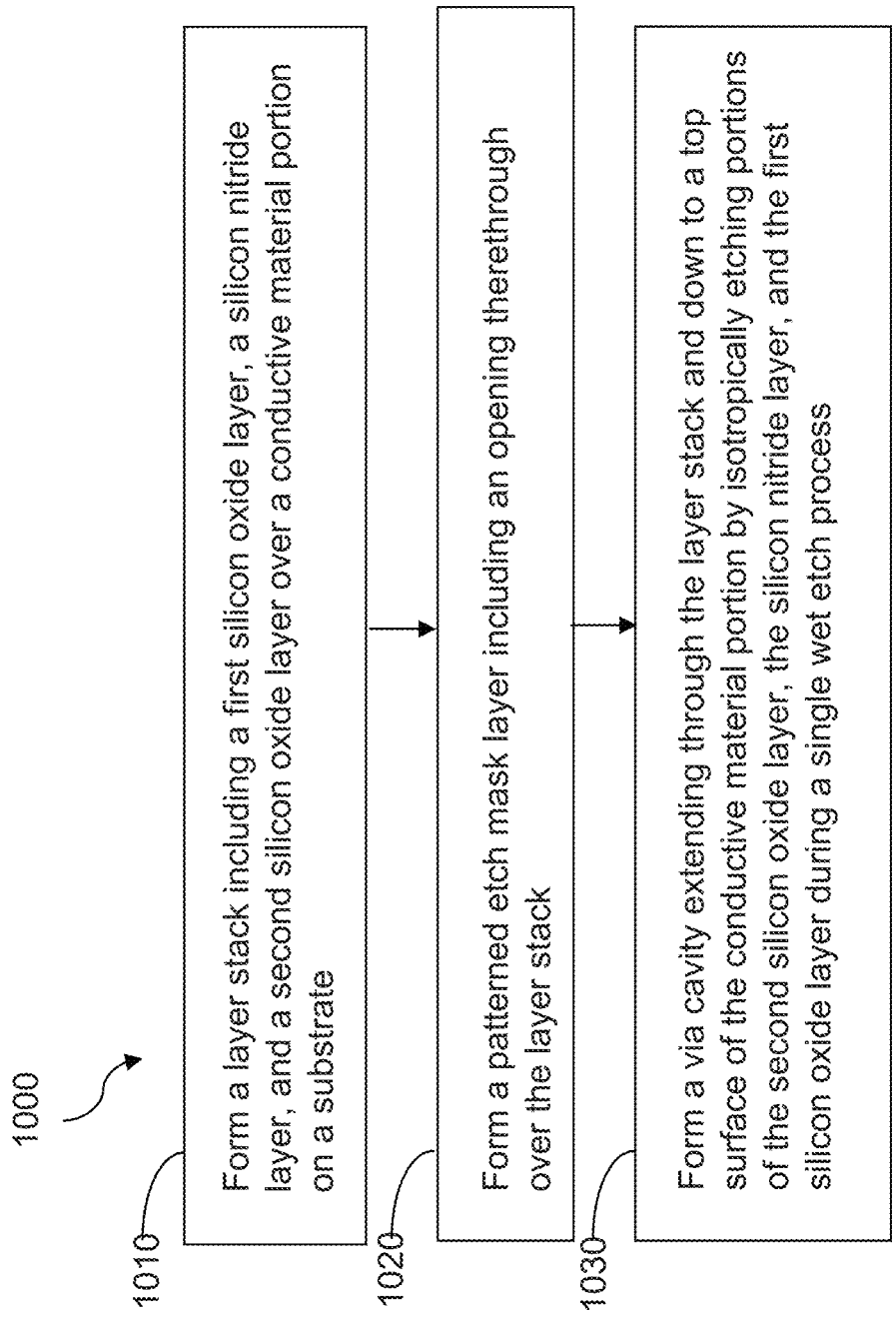
FIG. 10 is a flow chart illustrating an exemplary microfabrication method according to an embodiment of the present disclosure.

Referring to FIG. 10, a microfabrication method according to an embodiment of the present disclosure is illustrated in a flow chart 1000. In step 1010, a layer stack including a first silicon oxide layer 30, a silicon nitride layer 40, and a second silicon oxide layer 50 can be formed over a conductive material portion 20 on a substrate 10 using the methods described above. A structure may be provided, which includes a layer stack that contains, from bottom to top, the first silicon oxide layer 30, the silicon nitride layer 40, and the second silicon oxide layer 50 and the conductive material portion 20 underlying the layer stack (30, 40, 50) and overlying the substrate 10. In step 1020, a patterned etch mask layer 57 (such as a patterned photoresist layer) including an opening therethrough may be formed over the layer stack (30, 40, 50).

In step 1030, a via cavity 59 extending through the layer stack (30, 40, 50) and down to a top surface of the conductive material portion 20 may be formed by isotropically etching portions of the second silicon oxide layer 50, the silicon nitride layer 40, and the first silicon oxide layer 30 during a single wet etch process. In one embodiment, the single wet etch process may be employed, which uses a buffered oxide etch solution including an n:1 volume ratio mixture of 40% $NH_4F$ in water to 49% HF in water, n being in a range from 3 to 12. An etch rate of the silicon nitride layer 40 may be in a range from $\frac{1}{10}$ times an etch rate of the first silicon oxide layer 30 to $\frac{1}{2}$ times the etch rate of the first silicon oxide layer 30.

The microfabrication method (i.e., a method for forming structures having at least one dimension that is less than 1 micron) of the present disclosure enables patterning a layer stack including a first silicon oxide layer 30, a silicon nitride layer 40, and a silicon oxide layer 50 using a single etch process, which may be an isotropic etch process such as a wet etch process, to form a via cavity 59. For example, the wet etch process may use an n:1 BOE solution. Such a wet etch process is a low cost process that uses inexpensive wet etchant chemicals. Further, such a wet etch process utilizes commonly used wet etch tools that are typically used for other microfabrication processes, and thus, does not require purchase of a new process equipment. In addition, only a single patterned etch mask layer 57 such as a patterned photoresist layer is used for the microfabrication process of the present disclosure. Thus, a combination of a single lithographic patterning step and a single isotropic etch process may be used to pattern the layer stack including the first silicon oxide layer 30, the silicon nitride layer 40, and the silicon oxide layer 50 to form a via cavity 59. In addition, the elimination of dry etching processes in favor of a wet etch process may remove the potential for photoresist mask burn concerns. The various advantages of the disclosed embodiments provide significant cost savings and increased throughput during the microfabrication process.

To effect a single isotropic etch process that etches the layer stack including the first silicon oxide layer 30, the silicon nitride layer 40, and the silicon oxide layer 50, the etch rates of the first silicon oxide layer 30 and the second silicon oxide layer 50 in an isotropic etchant (such as the n:1 BOE solution) may be suppressed as low as possible, and the etch rate of the silicon nitride layer 40 may be enhanced as high as possible. For example, the deposition method and the material composition for the first silicon oxide material and the second silicon oxide material may be selected such that the etch rates of the first silicon oxide layer 30 and the second silicon oxide layer 50 are between 1.0 times the etch rate of thermal silicon oxide and 1.25 times the etch rate of the thermal silicon oxide. The etch rate of the silicon nitride material in the silicon nitride layer 40 can be enhanced by forming a stoichiometric silicon nitride material by a plasma enhanced silicon nitride deposition process. By maintaining the ratio of the etch rates of the silicon oxide materials of the first and second silicon oxide layers (30, 50) in the isotropic etchant to the etch rate of the silicon nitride material of the silicon nitride layer 40 within the range from 2 to 10, a via cavity 59 can be formed through the layer stack (30, 40, 50) with a sidewall profile described above. A metallic contact structure 60 can be formed in the via cavity 59 on the conductive material portion 20.

Embodiments of the present disclosure provide a low cost method of patterning a layer stack including a first silicon oxide layer 30, a silicon nitride layer 40, and a second silicon oxide layer 50 to form a via cavity 59. Further, the embodiments of the present disclosure provide a patterned structure in which a high taper angle □ at the straight tapered sidewalls of the silicon nitride layer 40 limit the area of the contact between the metallic contact structure 60 and the conductive material portion 20. The conductive material portion 20 may include a metallic material such as a metal pad or a metal line, or may include a transparent conductive oxide material. The methods of the present disclosure may be used for a substrate 10 having a low thermal conductivity and high optical transparency such as fused silica, quartz, or glass. Thus, various embodiment methods may be used for various optical components that use a substrate 10 having a low thermal conductivity.

The patterning method of various embodiments use a single patterned etch mask layer 57 and a single isotropic etch process (which can be a wet etch process). In contrast, conventional processes to form a via cavity through the oxide-nitride-oxide (ONO) layer stack typically use multiple etch processes. For example, a conventional process may use at least three etch processes (wet-dry-wet) that use at least two masks. One of ordinary skill in the art can appreciate the plurality of advantages that arise from use of a single isotropic etch process as disclosed in the various embodiments herein as opposed to the conventional methods that use multiple etch processes. For example, by using a single isotropic etch process in place of multiple etch processes, the various embodiments disclosed herein may significantly reduce the total processing cost and the total processing time. Such cost and time savings may be achieved because each additional etch process incurs additional cost and takes an additional processing time. Further, by reducing the processing steps to a single isotropic etch process that uses a single mask layer, the various embodiments disclosed herein further decrease the total processing cost and the total processing time because each additional etch mask layer used in a conventional process requires the application and patterning of a photoresist layer in a lithographic tool. In addition, as noted above, conventional processes may use three etch processes that include a wet etch, a dry etch, and another wet etch process. The patterning method of the various embodiments disclosed herein can employ a single wet etch process, and thus, avoid any possible damage to the second silicon oxide layer 50 that could occur during a dry etch process (such as a reactive ion etch process).

Embodiments of the present disclosure can thus provide a microscopic-scale device including a substrate 10, a conductive material portion 20, and a layer stack (30, 40, 50) including, from bottom to top, a first silicon oxide layer 30, a silicon nitride layer 40, and a second silicon oxide layer 50. In particular, in various embodiments, the microscopic-scale device may be an optical device. In such embodiments, the substrate 10 may include an optically transparent substrate such as fused silica, quartz, or glass. The conductive material portion 20 may include a transparent conductive material (such as a transparent oxide material) or a metal that is optically opaque. In one embodiment, a first optical device formed on the substrate 10 may include a transparent conductive material as the respective conductive material portion 20, and a second optical device formed on the substrate 10 may include a metal (an optically opaque material) as the respective conductive material portion 20. The optical device formed by the microfabrication process of the present disclosure may include an optical filter and/or an optical mirror and/or a beam splitter and/or other optical devices that may be derived by adjusting the thicknesses of the individual layers within the layer stack of the first silicon oxide layer 30, the silicon nitride layer 40, and the second silicon oxide layer 50. Further, electrical contact can be provided to each of the conductive material portions 20 within the optical devices formed on the substrate 10.

Referring to all drawings and according to various embodiments of the present disclosure, a structure is provided, which comprises: a conductive material portion 20 located on a substrate 10; a layer stack (30, 40, 50) including, from bottom to top, a first silicon oxide layer 30, a silicon nitride layer 40 has a refractive index in a range from 1.88 to 1.95 at 632.8 nm wavelength, and a second silicon oxide layer 50 and located over the conductive material portion 20; and a via cavity 59 extending through the layer stack (30, 40, 50), wherein sidewalls of the via cavity 59 includes first concave sidewalls of the first silicon oxide layer 30 that are adjoined to a top surface of the conductive material portion 20, straight tapered sidewalls of the silicon nitride layer 40 that are adjoined to a respective top end of the first concave sidewalls, and second concave sidewalls of the second silicon oxide layer 50 that are adjoined to a respective top end of the straight tapered sidewalls such that a width w of the via cavity 59 strictly increases with a vertical distance vd from a horizontal top surface of the conductive material portion 20. Strict increase of a quantity with a parameter means that an increase in the value of the quantity follows any increase in the value of the parameter.

As discussed above, the taper angle $\alpha$ of the straight tapered sidewalls of the silicon nitride layer may be determined by the ratio of the etch rate of the second silicon oxide material of the second silicon oxide layer 50 in an n:1 BOE solution (n being in a range from 3 to 12) to the etch rate of the silicon nitride layer 40 in the n:1 BOE solution. The ratio of the etch rates may be in a range from 2 to 10. In one embodiment, the straight tapered sidewalls of the silicon nitride layer 40 may have a taper angle in a range from 62 degrees (which is about the angle corresponding to the arctangent of 2) to 84 degrees (which is about the angle corresponding to the arctangent of 10) with respective to a vertical direction that is perpendicular to a top surface of the conductive material portion 20.

In one embodiment, the substrate 10 comprises, and/or consists essentially of, a transparent dielectric material selected from fused silica, quartz, and glass; and the conductive material portion 20 comprises, and/or consists essentially of, a material selected from a metallic material and a transparent conductive oxide material.

In one embodiment, the substrate 10 has a thickness in a range from 10 microns to 3 mm; the first silicon oxide layer 30 has a first thickness t1 in a range from 100 nm to 1,000 nm; the silicon nitride layer 40 has a second thickness t2 in a range from 50 nm to 500 nm; and the second silicon oxide layer 50 has a third thickness t3 in a range from 50 nm to 500 nm.

In one embodiment, the structure comprises a metallic contact structure 60 located in the via cavity 50 on a top surface of the conductive material portion 20.

According to an embodiment of the present disclosure, a microfabrication method is provided, which includes: providing a structure including a layer stack (30, 40, 50) that contains, from bottom to top, a first silicon oxide layer 30, a silicon nitride layer 40, and a second silicon oxide layer 50 and a conductive material portion 20 underlying the layer stack (30, 40, 50) and overlying a substrate 10; forming a patterned etch mask layer 57 including an opening therethrough over the layer stack (30, 40, 50); and forming a via cavity 59 extending through the layer stack (30, 40, 50) and down to a top surface of the conductive material portion 20 by isotropically etching portions of the second silicon oxide layer 50, the silicon nitride layer 40, and the first silicon oxide layer 30 using an isotropic etch process in which an etch rate of the silicon nitride layer 40 is in a range from 1/10 times an etch rate of the first silicon oxide layer 30 to 1/2 times the etch rate of the first silicon oxide layer 30. In one embodiment, the microfabrication method of the present disclosure can be employed to form an optical structure, which may include an optical filter, an optical mirror, or a beam splitter.

According to an embodiment of the present disclosure, a method of patterning a structure is provided, which includes: forming a layer stack (30, 40, 50) including a first silicon oxide layer 30, a silicon nitride layer 40, and a second silicon oxide layer 50 over a conductive material portion 20 on a substrate 10; forming a patterned etch mask layer 57 including an opening therethrough over the layer stack (30, 40, 50); and forming a via cavity 59 extending through the layer stack (30, 40, 50) and down to a top surface of the conductive material portion 20 by isotropically etching portions of the second silicon oxide layer 50, the silicon nitride layer 40, and the first silicon oxide layer 30 during a single wet etch process using a buffered oxide etch solution including an n:1 volume ratio mixture of 40% $NH_4F$ in water to 49% HF in water, n being in a range from 3 to 12. In one embodiment, the patterning method of the present disclosure can be employed to form an optical structure, which may include an optical filter, an optical mirror, or a beam splitter.

According to an embodiment of the present disclosure, a structure is provided, which includes: a conductive material portion 20 formed on a substrate 10; a layer stack (30, 40, 50) including a first silicon oxide layer 30, a silicon nitride layer 40, and a second silicon oxide layer 50 located over the conductive material portion 20; and a via cavity 59 extending through the layer stack (30, 40, 50) and down to a top surface of the conductive material portion 20 wherein sidewalls of the via cavity 59 includes first concave sidewalls of the first silicon oxide layer 30 that are adjoined to a top surface of the conductive material portion 20, straight tapered sidewalls of the silicon nitride layer 40 that are adjoined to a respective top end of the first concave sidewalls, and second concave sidewalls of the second silicon oxide layer 50 that are adjoined to a respective top end of the straight tapered sidewalls such that a width of the via cavity 59 strictly increases with a vertical distance from a horizontal top surface of the conductive material portion 20. The silicon nitride layer 40 may have a refractive index in a range from 1.88 to 1.95 at 632.8 nm wavelength. In one embodiment, the structure of the present disclosure can include an optical structure, which may include an optical filter, an optical mirror, or a beam splitter.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A microfabrication method, comprising:
providing a structure including a layer stack that contains, from bottom to top, a first silicon oxide layer, a silicon nitride layer, and a second silicon oxide layer and a conductive material portion underlying the layer stack and overlying a substrate;
forming a patterned etch mask layer including an opening therethrough over the layer stack; and
forming a via cavity extending through the layer stack and down to a top surface of the conductive material portion by isotropically etching portions of the second silicon oxide layer, the silicon nitride layer, and the first silicon oxide layer using an isotropic etch process in which an etch rate of the silicon nitride layer is in a range from 1/10 times an etch rate of the first silicon oxide layer to 1/2 times the etch rate of the first silicon oxide layer.

2. The microfabrication method of claim 1, wherein the isotropic etch process comprises a wet etch process using a buffered oxide etch solution including an n:1 volume ratio mixture of 40% $NH_4F$ in water to 49% HF in water, n being in a range from 3 to 12.

3. The microfabrication method of claim 1, wherein the silicon nitride layer is formed by chemical vapor deposition in which a silicon precursor gas and a nitrogen precursor gas combine to form a silicon nitride material.

4. The microfabrication method of claim 3, wherein the silicon nitride layer has a refractive index in a range from 1.88 to 1.95 at 632.8 nm wavelength.

5. The microfabrication method of claim 1, wherein:
the first silicon oxide layer comprises a first silicon oxide material formed by decomposition of tetraethylorthosilicate; and
the second silicon oxide layer comprises a second silicon oxide material formed by decomposition of tetraethylorthosilicate.

6. The microfabrication method of claim 5, wherein:
the first silicon oxide material and the second silicon oxide material are undoped silicate glass materials; and
the second silicon oxide material has an etch rate in a range from 0.80 times the etch rate of the first silicon oxide layer to 1.25 times the etch rate of the first silicon oxide layer.

7. The microfabrication method of claim 1, wherein the isotropic etch process comprises:
a first step in which a material of the second silicon oxide layer is isotropically etched with an undercut underneath the patterned etch mask layer while a remaining portion of the second silicon oxide layer covers the silicon nitride layer underneath the patterned etch mask layer;
a second step in which a material of the silicon nitride layer is etched at a lower etch rate than an etch rate of the second silicon oxide layer while straight tapered sidewalls are formed through the silicon nitride layer and a remaining portion of the silicon nitride layer covers the first silicon oxide layer underneath the patterned etch mask layer; and
a third step in which materials of the first silicon oxide layer and the second silicon oxide layer are etched while forming concave surfaces and the material of the silicon nitride layer is etched while the straight tapered sidewalls laterally move outward without forming concave surfaces.

8. The microfabrication method of claim 1, further comprising forming a metallic contact structure in the via cavity on a top surface of the conductive material portion.

9. The microfabrication method of claim 1, wherein the substrate comprises a transparent dielectric material selected from fused silica, quartz, and glass, and has a thickness in a range from 10 microns to 3 mm.

10. The microfabrication method of claim 1, wherein:
the conductive material portion comprises a material selected from a metallic material and a transparent conductive oxide material;
the first silicon oxide layer has a first thickness in a range from 100 nm to 1,000 nm;
the silicon nitride layer has a second thickness in a range from 50 nm to 500 nm; and
the second silicon oxide layer has a third thickness in a range from 50 nm to 500 nm.

11. A method of patterning a structure, comprising:
forming a layer stack including a first silicon oxide layer, a silicon nitride layer, and a second silicon oxide layer over a conductive material portion on a substrate;
forming a patterned etch mask layer including an opening therethrough over the layer stack; and
forming a via cavity extending through the layer stack and down to a top surface of the conductive material portion by isotropically etching portions of the second silicon oxide layer, the silicon nitride layer, and the first silicon oxide layer during a single wet etch process using a buffered oxide etch solution including an n:1 volume ratio mixture of 40% $NH_4F$ in water to 49% HF in water, n being in a range from 3 to 12.

12. The method of claim 11, wherein the layer stack is formed by:
forming the first silicon oxide layer by depositing a first silicon oxide material in a first chemical vapor deposition process;
forming the silicon nitride layer by depositing a silicon nitride material in a second chemical vapor deposition process; and
forming the second silicon oxide layer by depositing a second silicon oxide material in a third chemical vapor deposition process.

13. The method of claim 11, wherein an etch rate of the silicon nitride layer is in a range from 1/10 times an etch rate of the first silicon oxide layer to 1/2 times the etch rate of the first silicon oxide layer during the single wet etch process.

14. The method of claim 11, wherein:
the substrate comprises a transparent dielectric material selected from fused silica, quartz, and glass; and
the conductive material portion comprises a material selected from a metallic material and a transparent conductive oxide material.

15. The method of claim 14, further comprising forming a metallic contact structure in the via cavity on a top surface of the conductive material portion by depositing and patterning a conductive material.

16. A method of forming a structure, comprising:
providing a structure including a layer stack that contains, from bottom to top, a first silicon oxide layer, a silicon nitride layer, and a second silicon oxide layer and a conductive material portion underlying the layer stack and overlying a substrate;
forming a patterned etch mask layer including an opening therethrough over the layer stack; and
forming a via cavity extending through the layer stack and down to a top surface of the conductive material portion by isotropically etching portions of the second silicon oxide layer, the silicon nitride layer, and the first silicon oxide layer;
removing the patterned etch mask layer, whereby an optical structure comprising the substrate, the conductive material portion, the layer stack is provided; and
attaching the optical structure to a semiconductor chip.

17. The method of claim 16, further comprising:
forming a bonding pad within the via cavity directly on the top surface of the conductive material portion; and
attaching a solder material portion to the bonding pad.

18. The method of claim 17, wherein:
the semiconductor chip comprises a front bonding pad; and
the method comprises attaching the solder material portion to the front bonding pad, whereby the optical structure is bonded to the semiconductor chip via the solder material portion.

19. The method of claim 16, wherein forming the via cavity comprises performing an isotropic etch process that isotropically etches portions of the second silicon oxide layer, the silicon nitride layer, and the first silicon oxide layer during a single wet etch process using a buffered oxide etch solution including an n:1 volume ratio mixture of 40% $NH_4F$ in water to 49% HF in water, n being in a range from 3 to 12.

20. The method of claim 19, wherein the isotropic etch process comprises:
a first step in which a material of the second silicon oxide layer is isotropically etched with an undercut underneath the patterned etch mask layer while a remaining portion of the second silicon oxide layer covers the silicon nitride layer underneath the patterned etch mask layer;
a second step in which a material of the silicon nitride layer is etched at a lower etch rate than an etch rate of the second silicon oxide layer while straight tapered sidewalls are formed through the silicon nitride layer and a remaining portion of the silicon nitride layer covers the first silicon oxide layer underneath the patterned etch mask layer; and
a third step in which materials of the first silicon oxide layer and the second silicon oxide layer are etched while forming concave surfaces and the material of the silicon nitride layer is etched while the straight tapered sidewalls laterally move outward without forming concave surfaces.

\* \* \* \* \*